United States Patent
Kelman et al.

(10) Patent No.: US 8,889,233 B1
(45) Date of Patent: *Nov. 18, 2014

(54) METHOD FOR REDUCING STRESS IN POROUS DIELECTRIC FILMS

(75) Inventors: Maxim Kelman, Mountain View, CA (US); Krishnan Shrinivasan, San Jose, CA (US); Feng Wang, Fremont, CA (US); Victor Lu, Foster City, CA (US); Sean Chang, Sunnyvale, CA (US); Guangquan Lu, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 1191 days.

This patent is subject to a terminal disclaimer.

(21) Appl. No.: 11/369,311

(22) Filed: Mar. 6, 2006

Related U.S. Application Data

(63) Continuation-in-part of application No. 11/115,576, filed on Apr. 26, 2005.

(51) Int. Cl.
*C08F 2/48* (2006.01)

(52) U.S. Cl.
USPC .......................................... 427/508; 427/487

(58) Field of Classification Search
USPC ................................................ 427/487, 508
See application file for complete search history.

(56) References Cited

U.S. PATENT DOCUMENTS

| | | | |
|---|---|---|---|
| 3,704,219 A | 11/1972 | McDowell | |
| 3,983,385 A * | 9/1976 | Troue | 422/186.3 |
| 4,313,969 A | 2/1982 | Matthews et al. | |
| 4,357,451 A | 11/1982 | McDaniel | |
| 4,391,663 A | 7/1983 | Hutter, III | |
| 4,563,589 A | 1/1986 | Scheffer | |
| 4,751,191 A | 6/1988 | Gonsiorawski et al. | |
| 4,837,289 A | 6/1989 | Mueller et al. | |
| 4,882,008 A | 11/1989 | Garza et al. | |
| 4,885,262 A | 12/1989 | Ting et al. | |
| 4,927,786 A | 5/1990 | Nishida | |

(Continued)

FOREIGN PATENT DOCUMENTS

| | | |
|---|---|---|
| CN | 1531749 A | 9/2004 |
| CN | 1624895 | 6/2005 |

(Continued)

OTHER PUBLICATIONS

U.S. Office Action mailed Dec. 27, 2006, from U.S. Appl. No. 10/825,888.

(Continued)

*Primary Examiner* — Elena T Lightfoot
(74) *Attorney, Agent, or Firm* — Weaver Austin Villeneuve & Sampson LLP

(57) ABSTRACT

The present invention addresses provides improved methods of preparing a low-k dielectric material on a substrate. The methods involve multi-step ultraviolet curing processes in which UV intensity, wafer substrate temperature and other conditions may be independently modulated at each step. In certain embodiments, a film containing a structure former and a porogen is exposed to UV radiation in a first step to facilitate removal of the porogen and create a porous dielectric film. In a second step, the film is exposed to UV radiation to increase crosslinking within the porous film. In certain embodiments, the curing takes place in a multi-station UV chamber wherein UV intensity and substrate temperature may be independently controlled at each station.

26 Claims, 3 Drawing Sheets

(56) References Cited

U.S. PATENT DOCUMENTS

| | | | |
|---|---|---|---|
| 4,956,582 A | 9/1990 | Bourassa |
| 5,174,881 A | 12/1992 | Iwasaki et al. |
| 5,178,682 A | 1/1993 | Tsukamoto et al. |
| 5,195,045 A | 3/1993 | Keane et al. |
| 5,249,076 A | 9/1993 | Fujiwara et al. |
| 5,268,320 A | 12/1993 | Holler et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,300,331 A | 4/1994 | Schaeffer |
| 5,314,538 A | 5/1994 | Maeda et al. |
| 5,364,667 A | 11/1994 | Rhieu |
| 5,407,524 A | 4/1995 | Patrick et al. |
| 5,413,664 A | 5/1995 | Yagi et al. |
| 5,504,042 A | 4/1996 | Cho et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,667,592 A | 9/1997 | Boitnott et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,840,600 A | 11/1998 | Yamazaki et al. |
| 5,849,640 A | 12/1998 | Hsia et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 5,920,790 A | 7/1999 | Wetzel et al. |
| 6,015,503 A | 1/2000 | Butterbaugh et al. |
| 6,051,283 A | 4/2000 | Lee et al. |
| 6,090,442 A | 7/2000 | Klaus et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,149,828 A | 11/2000 | Vaartstra |
| 6,150,272 A | 11/2000 | Liu et al. |
| 6,171,661 B1 | 1/2001 | Zheng et al. |
| 6,177,329 B1 | 1/2001 | Pang |
| 6,228,563 B1 | 5/2001 | Starov et al. |
| 6,232,248 B1 | 5/2001 | Shinriki et al. |
| 6,232,658 B1 | 5/2001 | Catabay et al. |
| 6,239,018 B1 | 5/2001 | Liu et al. |
| 6,254,689 B1 | 7/2001 | Meder |
| 6,258,735 B1 | 7/2001 | Xia et al. |
| 6,268,276 B1 | 7/2001 | Chan et al. |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 * | 9/2001 | Tolles .......................... 451/526 |
| 6,306,564 B1 | 10/2001 | Mullee |
| 6,312,793 B1 | 11/2001 | Grill et al. |
| 6,329,017 B1 | 12/2001 | Liu et al. |
| 6,329,062 B1 | 12/2001 | Gaynor |
| 6,331,480 B1 | 12/2001 | Tsai et al. |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswamy et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,715 B1 | 9/2002 | Mukherjee et al. |
| 6,455,417 B1 | 9/2002 | Bao et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,500,770 B1 | 12/2002 | Cheng et al. |
| 6,518,130 B1 | 2/2003 | Ohno |
| 6,528,409 B1 | 3/2003 | Lopatin et al. |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,572,252 B1 | 6/2003 | Rangarajan et al. |
| 6,573,030 B1 | 6/2003 | Fairbairn et al. |
| 6,576,300 B1 | 6/2003 | Berry et al. |
| 6,576,345 B1 | 6/2003 | Cleemput et al. |
| 6,596,467 B2 | 7/2003 | Gallagher et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,635,575 B1 | 10/2003 | Xia et al. |
| 6,644,786 B1 | 11/2003 | Leben |
| 6,667,147 B2 | 12/2003 | Gallagher et al. |
| 6,677,251 B1 | 1/2004 | Lu et al. |
| 6,715,498 B1 | 4/2004 | Humayun et al. |
| 6,740,602 B1 | 5/2004 | Hendriks et al. |
| 6,740,605 B1 | 5/2004 | Shiraiwa et al. |
| 6,756,085 B2 * | 6/2004 | Waldfried et al. ............ 427/515 |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,815,373 B2 | 11/2004 | Singh et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,846,380 B2 | 1/2005 | Dickinson et al. |
| 6,848,458 B1 | 2/2005 | Shrinivasan et al. |
| 6,849,549 B1 | 2/2005 | Chiou et al. |
| 6,856,712 B2 | 2/2005 | Fauver et al. |
| 6,867,086 B1 | 3/2005 | Chen et al. |
| 6,884,738 B2 | 4/2005 | Asai et al. |
| 6,899,857 B2 * | 5/2005 | Pheng et al. ................... 423/338 |
| 6,902,440 B2 | 6/2005 | Dougan et al. |
| 6,903,004 B1 | 6/2005 | Spencer et al. |
| 6,914,014 B2 | 7/2005 | Li et al. |
| 6,921,727 B2 | 7/2005 | Chiang et al. |
| 6,943,121 B2 | 9/2005 | Leu et al. |
| 6,951,765 B1 | 10/2005 | Gopinath et al. |
| 6,958,301 B2 | 10/2005 | Kim et al. |
| 6,962,871 B2 * | 11/2005 | Lee et al. ....................... 438/624 |
| 6,967,160 B1 | 11/2005 | Paton et al. |
| 7,005,390 B2 | 2/2006 | Ramachandrarao et al. |
| 7,017,514 B1 | 3/2006 | Shepherd et al. |
| 7,018,918 B2 | 3/2006 | Kloster et al. |
| 7,025,831 B1 | 4/2006 | Butterbaugh et al. |
| 7,030,041 B2 | 4/2006 | Li et al. |
| 7,087,271 B2 | 8/2006 | Rhee et al. |
| 7,094,713 B1 | 8/2006 | Niu et al. |
| 7,097,712 B1 | 8/2006 | Yamazaki et al. |
| 7,112,541 B2 | 9/2006 | Xia et al. |
| 7,132,334 B2 | 11/2006 | Lin |
| 7,144,606 B2 | 12/2006 | Huang |
| 7,148,155 B1 | 12/2006 | Tarafdar et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,195,548 B1 | 3/2007 | Hardikar et al. |
| 7,208,389 B1 | 4/2007 | Tipton et al. |

(56) References Cited

U.S. PATENT DOCUMENTS

| | | |
|---|---|---|
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,264,676 B2 | 9/2007 | Lai et al. |
| 7,265,061 B1 | 9/2007 | Cho et al. |
| 7,297,608 B1 | 11/2007 | Papasouliotis et al. |
| 7,304,302 B1 | 12/2007 | Nunan et al. |
| 7,332,445 B2 * | 2/2008 | Lukas et al. ............... 438/780 |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,402,532 B2 | 7/2008 | Clevenger et al. |
| 7,481,882 B2 | 1/2009 | Won et al. |
| 7,482,265 B2 * | 1/2009 | Chen et al. ................ 438/637 |
| 7,504,663 B2 | 3/2009 | Yamazaki et al. |
| 7,510,982 B1 | 3/2009 | Draeger et al. |
| 7,538,012 B2 | 5/2009 | Ohmi et al. |
| 7,557,035 B1 | 7/2009 | Ryan et al. |
| 7,611,757 B1 | 11/2009 | Bandyopadhyay et al. |
| 7,622,162 B1 | 11/2009 | Schravendijk et al. |
| 7,629,224 B1 | 12/2009 | Van Den Hoek et al. |
| 7,705,431 B1 | 4/2010 | Sanganeria et al. |
| 7,790,633 B1 | 9/2010 | Tarafdar et al. |
| 7,851,232 B2 | 12/2010 | van Schravendijk et al. |
| 7,858,533 B2 | 12/2010 | Liu et al. |
| 7,892,985 B1 | 2/2011 | Cho et al. |
| 7,906,174 B1 | 3/2011 | Wu et al. |
| 7,972,976 B1 | 7/2011 | Van Den Hoek |
| 8,043,667 B1 | 10/2011 | Bandyopadhyay et al. |
| 8,062,983 B1 | 11/2011 | Draeger et al. |
| 8,063,983 B2 | 11/2011 | Kotake et al. |
| 8,137,465 B1 | 3/2012 | Shrinivasan et al. |
| 8,211,510 B1 | 7/2012 | Varadarajan et al. |
| 8,242,028 B1 | 8/2012 | van Schravendijk et al. |
| 8,454,750 B1 | 6/2013 | Shrinivasan et al. |
| 8,465,991 B2 | 6/2013 | Varadarajan et al. |
| 8,512,818 B1 | 8/2013 | Varadarajan et al. |
| 8,629,068 B1 | 1/2014 | Shrinivasan et al. |
| 8,715,788 B1 | 5/2014 | Bandyopadhyay et al. |
| 2001/0001501 A1 | 5/2001 | Lee et al. |
| 2001/0014512 A1 | 8/2001 | Lyons et al. |
| 2002/0001973 A1 | 1/2002 | Wu et al. |
| 2002/0015850 A1 | 2/2002 | Nakamura et al. |
| 2002/0016085 A1 | 2/2002 | Huang et al. |
| 2002/0034626 A1 | 3/2002 | Liu et al. |
| 2002/0052124 A1 | 5/2002 | Raaijmakers et al. |
| 2002/0064341 A1 | 5/2002 | Fauver et al. |
| 2002/0094388 A1 | 7/2002 | Fonash et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0141024 A1 | 10/2002 | Retschke et al. |
| 2002/0148563 A1 | 10/2002 | Carlson et al. |
| 2002/0172766 A1 | 11/2002 | Laxman et al. |
| 2002/0187627 A1 | 12/2002 | Yuang |
| 2002/0192980 A1 | 12/2002 | Hogle et al. |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0066544 A1 | 4/2003 | Jur et al. |
| 2003/0068881 A1 | 4/2003 | Xia et al. |
| 2003/0119307 A1 | 6/2003 | Bekiaris et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0198742 A1 | 10/2003 | Vrtis et al. |
| 2003/0198895 A1 | 10/2003 | Toma et al. |
| 2003/0199603 A1 * | 10/2003 | Walker et al. ............... 522/99 |
| 2003/0203321 A1 | 10/2003 | Ma et al. |
| 2003/0227087 A1 | 12/2003 | Kakamu et al. |
| 2003/0228769 A1 | 12/2003 | Chen et al. |
| 2003/0228770 A1 | 12/2003 | Lee et al. |
| 2004/0002617 A1 | 1/2004 | Rantala et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1 | 4/2004 | Rice et al. |
| 2004/0069410 A1 | 4/2004 | Moghadam et al. |
| 2004/0072405 A1 | 4/2004 | Yao et al. |
| 2004/0082163 A1 | 4/2004 | Mori et al. |
| 2004/0096586 A1 | 5/2004 | Schulberg et al. |
| 2004/0096593 A1 * | 5/2004 | Lukas et al. ............... 427/558 |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0102032 A1 | 5/2004 | Kloster et al. |
| 2004/0115933 A1 | 6/2004 | Jung et al. |
| 2004/0152239 A1 | 8/2004 | Bao et al. |
| 2004/0161532 A1 | 8/2004 | Kloster et al. |
| 2004/0166240 A1 | 8/2004 | Rhee et al. |
| 2004/0170760 A1 | 9/2004 | Meagley et al. |
| 2004/0175501 A1 | 9/2004 | Lukas et al. |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0266214 A1 | 12/2004 | Suguro et al. |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1 | 2/2005 | Clark et al. |
| 2005/0056369 A1 | 3/2005 | Lai et al. |
| 2005/0064698 A1 | 3/2005 | Chang et al. |
| 2005/0064712 A1 | 3/2005 | Andreas |
| 2005/0064726 A1 | 3/2005 | Reid et al. |
| 2005/0079717 A1 | 4/2005 | Savas et al. |
| 2005/0095840 A1 | 5/2005 | Bhanap et al. |
| 2005/0101154 A1 | 5/2005 | Huang |
| 2005/0112282 A1 | 5/2005 | Gordon et al. |
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0233598 A1 | 10/2005 | Jung et al. |
| 2005/0255712 A1 | 11/2005 | Kato et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0024868 A1 * | 2/2006 | Waldfried et al. ............ 438/778 |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0105106 A1 | 5/2006 | Balseanu et al. |
| 2006/0110931 A1 | 5/2006 | Fukazawa et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0197881 A1 | 9/2006 | Kang et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |

(56) References Cited

U.S. PATENT DOCUMENTS

| | | |
|---|---|---|
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0020952 A1 | 1/2007 | Lin et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0065578 A1 | 3/2007 | McDougall et al. |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0196972 A1 | 8/2007 | Shima |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0254204 A1 | 11/2007 | Shin et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0026579 A1 | 1/2008 | Lai et al. |
| 2008/0053615 A1 | 3/2008 | Sago et al. |
| 2008/0132055 A1 | 6/2008 | Nguyen et al. |
| 2008/0199977 A1 | 8/2008 | Weigel et al. |
| 2008/0242118 A1 | 10/2008 | Dimitrakopoulos et al. |
| 2008/0254643 A1 | 10/2008 | Clevenger et al. |
| 2008/0286697 A1 | 11/2008 | Verhaverbeke et al. |
| 2008/0305600 A1 | 12/2008 | Liao et al. |
| 2008/0318437 A1 | 12/2008 | Kim et al. |
| 2008/0318438 A1 | 12/2008 | Nakamura et al. |
| 2009/0017640 A1 | 1/2009 | Huh et al. |
| 2009/0039475 A1 | 2/2009 | Shioya |
| 2009/0059406 A1 | 3/2009 | Powers et al. |
| 2009/0207624 A1 | 8/2009 | Ma et al. |
| 2009/0243001 A1 | 10/2009 | Ramkumar et al. |
| 2009/0278116 A1 | 11/2009 | Yamate |
| 2010/0018460 A1 | 1/2010 | Singh et al. |
| 2010/0216303 A1 | 8/2010 | Ohkura |
| 2010/0261349 A1 | 10/2010 | Van Schravendijk et al. |
| 2010/0267231 A1 | 10/2010 | Van Schravendijk et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2011/0236593 A1 | 9/2011 | Okino et al. |
| 2012/0061718 A1 | 3/2012 | Yamazaki et al. |
| 2014/0080324 A1 | 3/2014 | Shrinivasan et al. |
| 2014/0094038 A1 | 4/2014 | Haverkamp et al. |

FOREIGN PATENT DOCUMENTS

| | | |
|---|---|---|
| CN | 101005023 A | 7/2007 |
| CN | 102074500 | 5/2011 |
| JP | 62-229833 | 10/1987 |
| JP | 01-107519 | 4/1989 |
| JP | 5031735 | 2/1993 |
| JP | 5138658 | 6/1993 |
| JP | 09-306892 | 11/1997 |
| JP | 11214364 A | 8/1999 |
| JP | 2001104776 | 4/2001 |
| JP | 2006165573 | 6/2006 |
| JP | 2007-508691 | 4/2007 |
| JP | 2007194582 | 8/2007 |
| JP | 63-307740 | 12/2008 |
| JP | 2010-103151 | 6/2010 |
| KR | 2000-0043888 | 7/2000 |
| KR | 10-1201039 | 11/2012 |
| TW | 201130045 | 9/2011 |
| TW | 201237959 | 9/2012 |
| WO | WO95/07543 | 3/1995 |
| WO | WO 95/07543 | 3/1995 |
| WO | 2006/104583 | 10/2006 |
| WO | 2006/127463 | 11/2006 |
| WO | 2007/043206 | 4/2007 |
| WO | 2008/156608 | 12/2008 |
| WO | 2012/087620 | 6/2012 |

OTHER PUBLICATIONS

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

U.S. Office Action mailed Sep. 8, 2006, from U.S. Appl. No. 10/404,693.

U.S. Office Action mailed Sep. 7, 2006, from U.S. Appl. No. 10/820,525.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Dhas et al., "Method of Reducing Defects in PECVD TEOS Films," Novellus Systems, Inc., U.S. Appl. No. 11/396,303, filed Mar. 30, 2006, pp. 1-21.

U.S. Appl. No. 11/824,049, Notice of Allowance mailed Jun. 22, 2009.

U.S. Appl. No. 11/824,049, Allowed Claims.

U.S. Appl. No. 11/688,695, Office Action mailed Jun. 11, 2009.

U.S. Appl. No. 11/696,102, Office Action mailed Jul. 1, 2009.

Yu, J.J. et al., "UV Annealing of Ultrathin Tantalum Oxide Films", Applied Surface Science, V 186 (2002), 57-63.

U.S. Appl. No. 11/811,048, Notice of Allowance mailed Aug. 17, 2009.

U.S. Appl. No. 11/811,048, Allowed Claims.

U.S. Appl. No. 11/608,056, Office Action mailed Aug. 20, 2009.

P. Morin et al., "Tensile contact etch stop layer for nMOS performance enhancement: influence of the film morphology", ECS meeting, May 2005.

Takagi et al., "High Rate Deposition of a-Si:H and a-SiN$_x$:H by VHF PECVD", Vacuum, 51, 1998.

Smith, D.L et al., "Mechanism of SiN$_3$-SiH$_4$ Llasma", J. Electrochem. Soc., vol. 137 (2) 1990.

Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.

Varadarajan et al., "Use of VHF RF plasma to deposit high tensile stress films with improved film properties for use in strained silicon technology", U.S. Appl. No. 11/975,473, filed Oct. 18, 2007.

U.S. Appl. No. 11/975,473, Office Action mailed Oct. 28, 2008.

U.S. Appl. No. 11/975,473, Office Action mailed Mar. 23, 2009.

Jiang et al., "Tensile dielectric films using UV curing", U.S. Appl. No. 11/899,683, filed Sep. 7, 2007.

(56) References Cited

OTHER PUBLICATIONS

U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al, "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Office Action mailed Feb. 4, 2009, from U.S. Appl. No. 11/280,113.
U.S. Office Action mailed Feb. 5, 2009, from U.S. App. No. 11/606,340.
Notice of Allowance mailed Jul. 28, 2009, from U.S. Appl. No. 11/606,340.
Van Den Hoek, et al., "VLSI Fabrication Processes for Introducing Pores Into Dielectric Materials," U.S. Appl. No. 12/606,920, filed Oct. 27, 2009.
Draeger, et al., "Creation of Porosity in Low-K Films by Photo-Disassociation of Imbedded Nanoparticles," U.S. Appl. No. 12/369,384, filed Feb. 11, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive UV Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-$k$ dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/115,576, Office Action mailed Apr. 15, 2010.
U.S. Appl. No. 11/519,445, Notice of Allowance mailed Apr. 21, 2010.
U.S. Appl. No. 11/519,445, Allowed Claims.
U.S. Appl. No. 11/561,834, Office Action mailed May 21, 2010.
U.S. Appl. No. 12/646,830, "UV and Reducing Treatment for K Recovery and Surface Clean in Semiconductor Processing", Varadarajan, Bhadri et al., filed Dec. 23, 2009.
U.S. Office Action mailed Aug. 7, 2009, from U.S. Appl. No. 11/280,113.

U.S. Final Office Action mailed Mar. 18, 2010, from U.S. Appl. No. 11/280,113.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-$k$ films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 12/566,514, Office Action mailed Jan. 11, 2011.
U.S. Appl. No. 11/561,834, Final Office Action mailed Dec. 3, 2010.
U.S. Appl. No. 11/696,102, Office Action mailed Jan. 26, 2011.
U.S. Appl. No. 11/688,695, Office Action mailed Feb. 1, 2011.
U.S. Appl. No. 11/146,456, Notice of Allowance mailed Nov. 10, 2008.
U.S. Appl. No. 11/146,456, Supplemental Notice of Allowance mailed Dec. 15, 2008.
U.S. Office Action mailed Feb. 22, 2011, from U.S. Appl. No. 12/369,384.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.
U.S. Appl. No. 11/731,581, Office Action mailed Jun. 2, 2011.
U.S. Appl. No. 12/646,830, "UV and reducing treatment for K recovery and surface clean in semiconductor processing", Varadarajan et al., filed Dec. 23, 2009.
U.S. Appl. No. 11/977,792, Office Action mailed Jul. 6, 2011.
U.S. Appl. No. 11/897,838, Office Action mailed Jul. 11, 2011.
U.S. Appl. No. 12/646,830, Office Action mailed Jul. 15, 2011.
Notice of Allowance for U.S. Appl. No. 12/566,514, mailed Jul. 13, 2011.
Allowed Claims as of Jul. 13, 2011 for U.S. Appl. No. 12/566,514.
U.S. Appl. No. 11/696,102, Final Office Action mailed Aug. 11, 2011.
U.S. Office Action mailed Nov. 23, 2010 from U.S. Appl. No. 12/606,920.
Notice of Allowance mailed Oct. 7, 2010, from U.S. Appl. No. 11/280,113.
Allowed Claims as of Oct. 7, 2010, for U.S. Appl. No. 11/280,113.
Notice of Allowance for U.S. Appl. No. 12/369,384, mailed Aug. 19, 2011.
Allowed Claims as of Aug. 19, 2011 for U.S. Appl. No. 12/369,384.
Korean Notification of Provisional Rejection mailed Dated Jul. 12, 2011 for Application No. 10-2010-0066153.
U.S. Appl. No. 12/973,549, Office Action mailed Oct. 11, 2011.
U.S. Appl. No. 11/977,792, Office Action mailed Oct. 24, 2011.
U.S. Appl. No. 10/972,084, Office Action mailed Oct. 27, 2011.
U.S. Appl. No. 11/656,661, Final Office Action mailed Nov. 10, 2011.
U.S. Appl. No. 12/940,324, Office Action mailed Dec. 13, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 12/210,060, Office Action mailed Nov. 28, 2011.
U.S. Appl. No. 12/646,830, Office Action mailed Jan. 11, 2012.
U.S. Appl. No. 11/688,695, Office Action mailed Dec. 14, 2011.
U.S. Appl. No. 12/840,192, Office Action mailed Feb. 6, 2012.
U.S. Appl. No. 13/275,209, Office Action mailed Mar. 12, 2012.
U.S. Appl. No. 11/696,102, Notice of Allowance mailed Feb. 24, 2012.
Allowed Claims as of Feb. 24, 2012 for U.S. Appl. No. 11/696,102.
U.S. Appl. No. 11/897,838, Notice of Allowance mailed Mar. 2, 2012.
Allowed Claims as of Mar. 2, 2012 for U.S. Appl. No. 11/897,838.

(56) References Cited

OTHER PUBLICATIONS

Deshmukh, et al., "Remote Plasma Etching Reactors: Modeling and Experiment," *J. Vac. Sci. Technol.*, B 11(2), Mar./Apr. 1993, pp. 206-215.

SG patent application No. 2010079747, Examination Report mailed Apr. 25, 2012.

U.S. Appl. No. 10/972,084, Office Action mailed May 1, 2012.

U.S. Appl. No. 12/726,263, Office Action mailed May 31, 2012.

Varadarajan et al., "A Cascaded Cure Approach to Fabricate Highly Tensile Silicon Nitride Films," Novellus Systems, Inc., U.S. Appl. No. 13/487,051, filed Jun. 1, 2012.

U.S. Appl. No. 12/646,830, Final Office Action mailed May 25, 2012.

Notice of Allowance for U.S. Appl. No. 12/606,920 mailed Mar. 25, 2011 and allowed claims.

U.S. Office Action dated Jul. 19, 2012 issued in U.S. Appl. No. 11/656,661.

U.S. Final Office Action dated Jul. 19, 2012 issued in U.S. Appl. No. 12/840,192.

U.S. Notice of Allowance dated Sep. 20, 2012 issued in U.S. Appl. No. 12/840,192.

U.S. Office Action dated Oct. 5, 2012 issued in U.S. Appl. No. 10/972,084.

U.S. Supplemental Notice of Allowance dated Oct. 8, 2009 issued in U.S. Appl. No. 11/811,048.

U.S. Final Office Action dated Jun. 21, 2012 issued in U.S. Appl. No. 11/688,695.

U.S. Notice of Allowance dated Oct. 4, 2012 issued in U.S. Appl. No. 11/688,695.

U.S. Office Action dated Aug. 28, 2012 issued in U.S. Appl. No. 11/731,581.

U.S. Final Office Action dated Sep. 10, 2012 issued in U.S. Appl. No. 12/726,263.

US Office Action, dated Jan. 3, 2013, issued in U.S. Appl. No. 13/487,051.

U.S. Final Office Action dated Oct. 3, 2012 issued in U.S. Appl. No. 12/210,060.

US Office Action dated Jun. 7, 2012 issued in U.S. Appl. No. 12/973,549.

U.S. Office Action dated Jan. 3, 2013 issued in U.S. Appl. No. 12/973,549.

Korean Notification of Provisional Rejection dated Mar. 26, 2012 issued in Appl. No. 10-2010-0066153.

PCT International Search Report and Written Opinion dated Dec. 26, 2012, issued in WO Patent Application No. PCT/US2011/064246.

U.S. Appl. No. 10/672,305, filed Sep. 26, 2003, entitled "Method for Removal of Porogens From Porous Low-K Films Using Supercritical Fluids".

US Office Action, dated Sep. 7, 2004, issued in U.S. Appl. No. 10/672,311.

U.S. Appl. No. 10/404,693, filed Mar. 31, 2003, entitled "Method for Forming Porous Films by Porogen Removal Combined with in Situ Surface Modification,".

U.S. Appl. No. 13/886,694, filed May 3, 2013, entitled "Multi-Station Sequential Curing of Dielectric Films."

U.S. Final Office Action dated Jan. 30, 2013 issued in U.S. Appl. No. 11/656,661.

U.S. Office Action dated Mar. 15, 2013 issued in U.S. Appl. No. 12/840,192.

U.S. Final Office Action dated Aug. 8, 2013 issued in U.S. Appl. No. 10/972,084.

U.S. Notice of Allowance dated Feb. 14, 2013 issued in U.S. Appl. No. 11/688,695.

U.S. Office Action dated Jul. 19, 2013 issue in U.S. Appl. No. 13/886,694.

U.S. Notice of Allowance dated Sep. 12, 2013 issue in U.S. Appl. No. 13/886,694.

U.S. Final Office Action dated Jun. 14, 2013 issued in U.S. Appl. No. 11/731,581.

U.S. Office Action dated Mar. 6, 2013 issued in U.S. Appl. No. 12/726,263.

US Final Office Action, dated Aug. 7, 2013, issued in U.S. Appl. No. 12/726,263.

US Notice of Allowance, dated Apr. 22, 2013, issued in U.S. Appl. No. 13/487,051.

U.S. Office Action dated Mar. 6, 2013 issued in U.S. Appl. No. 12/646,830.

U.S. Notice of Allowance dated Feb. 22, 2013 issued in U.S. Appl. No. 12/973,549.

Chinese Office Action dated Jan. 14, 2013 issued in Appl. No. 201010539625.7.

Taiwan Office Action dated Mar. 27, 2013 issued in Application No. 099123184.

US Office Action (Supplemental), dated Jan. 10, 2006, issued in U.S. Appl. No. 10/672,311.

Asoh et al., (Mar./Apr. 2001) "Fabrication of Ideally Ordered Anodic Porous Alumina with 63 nm Hole Periodocity Using Sulfuric Acid," *J. Vac. Sci. Technol. B* 19(2):569-572.

Asoh et al., (2001) "Conditions for Fabrication ofIdeally Ordered Anodic Porous Alumina Using Pretextured Al," *Journal ofthe Electrochemica Society*, 148(4):B152-B156.

Caluwaerts et al, "Post Patterning Meso Porosity Creation: A Potential Solution for Pore Sealing," IEEE 2003, 3 pp.

Calvert and Gallagher, (Nov. 2003) "A New Approach to Ultralow-k Dielectrics," *Semiconductor International*, 26(12):56, 4 pages.

Clube et al., Fine-Pattern Lithography for Large Substrates Using a Holographicmask-Aligner (Revised Version), White Paper from Holotronic Technologies SA; [downloaded from www.hdotronic.com/whiteoaoerlfine-oatt.odf on Mar. 12, 2002].

Ghani et al., "A 90nm High Volume Manufacturing Logic Technology Featuring Novel 45nm Gate Length Strained Silicon CMOS Transistors" IEEE, © 2003, 4 pp.

Holland et al., (Mar./Apr. 1999) "Nonlithographic Technique for the Production of Large Area High Density Gridded Field Sources," *J. Vac. Sci. Technol.* B 17(2):580-582.

Jan, C.H., et al., (2003) 90 nm Generation, 300mm Wafer Low k ILD/Cu Interconnect Technology, *IEEE Interconnect Technology Conference*, 3 pp.

Jin et al., (Oct. 1997) "Nanoporous Silica as an Ultralow-k Dielectric," *MRS Bulletin*, pp. 39-42.

Masuda et al. (Nov. 1997) "Highly Ordered Nanochannel-Array Architecture in Anodic Alumina," *App. Phys. Lett.* 71(19):2770-2772.

Meli et al., (2002) "Self-Assembled Masks for the Transfer of Nanometer-Scale Patterns into Surfaces: Characterization by AFM and LFM", *Nano Letters*, 2(2):131-135.

Miller et al., (Oct. 1997) "Phase-Separated Inorganic-Organic Hybrids for Microelectronic Applications," *MRS Bulletin*, pp. 44-48.

Shipley Claims Porous Low K Dielectric Breakthrough, *Press Release* Mar. 17, 2003, 1 page.

Singer, (Apr. 1, 2004) "New Materials and Designs to Improve Transistor Performance", *Semiconductor International*, 5 pp.

Van Bavel et al. (Feb. 3, 204) "Efficient Pore Sealing Crucial for Future Interconnects." *Future Fab International*, vol. 16, 9 pp.

Varadarajan, (Aug. 21, 2003) "Tensile Silicon Nitride- P1264 NESL", *C & F Study*, 12 pp.

Bandyopadhyay et al., "Method to Improve Mechanical Strength of Low-K Dielectric Film Using Modulated UV Exposure," Novellus Systems, Inc., U.S. Appl. No. 13/275,209, filed Oct. 17, 2011.

Haverkamp et al , "Enhancing adhesion of cap layer films", U.S. Appl. No. 14/026,894, filed Sep. 13, 2013.

U.S. Office Action dated Jul. 25, 2013 issued in U.S. Appl. No. 13/275,209.

U.S. Notice of Allowance dated Jan. 9, 2014 issued in U.S. Appl. No. 13/275,209.

U.S. Notice of Allowance dated May 3, 2010 issued in U.S. Appl. No. 11/519,445.

U.S. Final Office Action dated May 22, 2013 issued in U.S. Appl. No. 10/972,084.

U.S. Final Office Action dated Jul. 30, 2013 issued in U.S. Appl. No. 12/646,830.

Chinese Second Office Action dated Sep. 10, 2013 issued in Appl. No. 201010539625.7.

(56) References Cited

OTHER PUBLICATIONS

PCT International Preliminary Report on Patentability and Written Opinion dated Jul. 4, 2013, issued in PCT/US2011/064246.
Korean Office Action dated Sep. 26, 2013, issued in KR 2013-7019282.
Korean Second Office Action dated Dec. 5, 2013, issued in KR 2013-7019282.
Taiwan Search Report dated Aug. 20, 2013 issued in TW 100147212.
U.S. Office Action mailed Jul. 12, 2006, from U.S. Appl. No. 10/672,305.
U.S. Office Action mailed Aug. 14, 2007, from U.S. Appl. No. 10/404,693.
U.S. Office Action mailed Feb. 2, 2007, from U.S. Appl. No. 10/672,305.
Willibrordus Gerardus Maria van den Hoek et al., "VLSI Fabrication Processes for Introducing Pores Into Dielectric Materials," U.S. App. No. 11/606,340, filed Nov. 28, 2006.
Cabarrocas et al., "Plasma production of nanacrystalline silicon particles and polymorphous silicon thin films for large-area electronic devices," Pure Appl. Chem., vol. 74, No. 3, pp. 359-367, 2002.
Kim et al., "Particle formation during low-pressure chemical vapor deposition from silane and oxygen: Measurement, modeling, and film properties," J. Vac. Sci. Technol. A 20(2), Mar./Apr. 2002, pp. 413-423.
Suh et al., "Modeling particle formation during low-pressure silane oxidation: Detailed chemical kinetics and aerosol dynamics," J. Vac. Sci. Technol. A 19(3), May/Jun. 2001, pp. 940-951.
Ostraat, et al., "Ultraclean Two-Stage Aerosol Reactor for Production of Oxide-Passivated Silicon Nanoparticles for Novel Memory Devices," Journal of The Electrochemical Society, 148 (5) G265-G270 (2001).
Girshick et al., "Numerical Modeling of Gas-Phase Nucleation and Particle Growth during Chemical Vapor Deposition of Silicon," Journal of the Electrochemical Society, 147 (6) 2303-2311 (2000).
Fonzo, et al., "Focused nanoparticle-beam deposition of patterned microstructures," Applied Physics Letters, vol. 77, No. 6, Aug. 7, 2000, pp. 910-912.
Notice of Allowance mailed May 22, 2006, from U.S. Appl. No. 10/672,311.
Allowed Claims from U.S. Appl. No. 10/672,311, filed Sep. 26, 2003.
Notice of Allowance mailed Oct. 3, 2006, from U.S. Appl. No. 10/785,235.
Allowed Claims from U.S. Appl. No. 10/785,235, filed Feb. 23, 2004.
U.S. Office Action mailed Dec. 12, 2007, from U.S. Appl. No. 11/146,456.
U.S. Office Action mailed Nov. 28, 2007, from U.S. Appl. No. 10/807,680.
R.J. Lewis, Sr., Hawley's Condensed Chemical Dictionary, 12$^{th}$ edition, Van Norstrand Reinhold Co., New York, 1993 (no month), excerpts pp. 916-918 & 1123-1124.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.
Humayun et al., "Method for Forming Porous Films by Porogen Removel Combined Wtih in Situ Surface Modification", Novellus Corporation, U.S. Appl. No. 10/404,693, filed Mar. 31, 2003, pp. 1-32.
Tipton et al., "Method of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.
Wu et al., U.S. Appl. No. 10/789,103, entitled: Methods for Producing Low-K CDO Films With Low Residual Stress, filed Feb. 27, 2004.
Wu et al., U.S. Appl. No. 10/820,525, entitled: Methods for Producing Low-K CDO Films With Low Residual Stress, filed Apr. 7, 2004.
Wu et al., U.S. Appl. No. 10/800,409, entitled: Methods for Producing Low-K CDO Films, filed Mar. 11, 2004.
U.S. Appl. No. 10/016,017, filed Dec. 12, 2001.
U.S. Appl. No. 10/125,614, filed Apr. 18, 2002.
U.S. Appl. No. 10/202,987, filed Jul. 23, 2002.
Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.
Gangpadhyay et al., "The First International Surface Cleaning Workshop," Northeastern University, Nov. 11-14, 2002.
Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Humayun et al., "Method for Forming Porous Films by Porogen Removal Combined With in Situ Modification", U.S. Appl. No. 10/404,693, filed Mar. 31, 2003, Office Action dated Mar. 15, 2005.
Tipton et al., "Method of Porogen Removal From Porous Low-K Films Using UV Radiation", , U.S. Appl. No. 10/672,311, filed Sep. 26, 2003, Office Action dated Sep. 7, 2004.
Tipton et al., "Method of Porogen Removal From Porous Low-K Films Using UV Radiation", U.S. Appl. No. 10/672,311, filed Sep. 26, 2003, Office Action dated Dec. 28, 2004.
Tipton et al., "Method for Removal of Porogens From Porous Low-K Films Using Supercritical Fluids", U.S. Appl. No. 10/672,305, Office Action dated Mar. 22, 2005.
Bandyopadhyay et al., "Method to Improve Mechanical Strength of Low-K Dielectric Film Using Modulated UV Exposure", U.S. Appl. No. 10/825,888, filed Apr. 16, 2004.
R.D. Miller et al., "Phase-Separated Inorganic-Organic Hybrids for Microelectronic Applications," MRS Bulletin, Oct. 1997, pp. 44-48.
Jin et al., "Nanoporous Silica as an Ultralow-$k$ Dielectric," MRS Bulletin, Oct. 1997, pp. 39-42.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.
Asoh et al., "Conditions for Fabrication of Ideally Ordered Anodic Porous Alumina Using Pretextured Al," Journal of the Electrochemica Society, 148 (4) B152-B156 (2001) pp. B152-B156.
Holland et al., "Nonlithographic Technique for the Production of Large Area High Density Gridded Field Sources," J. Vac. Sci. Technol. B 17(2), Mar./Apr. 1999, pp. 580-582.
Masuda et al. "Highly Ordered Nanochannel-Array Architecture in Anodic Alumina," App. Phys. Lett. 71(19), Nov. 1997, pp. 2770-2772.
Clube et al., White Paper from Holotronic Technologies SA; downloaded from www.hdotronic.com/whitepaper/fine-patt.pdf on Mar. 12, 2002.
Meli et al., "Self-Assembled Masks for the Transfer of Nanometer-Scale Patterns into Surfaces: Characterization by AFM and LFM", Nano Letters, vol. 2, No. 2, 2002, 131-135.
"Shipley Claims Porous Low K Dielectric Breakthrough," Press Release Mar. 17, 2003.
Jeffrey M. Calvert and Michael K. Gallagher, Semiconductor International, 26 (12), 56 (2003).
Van Bavel et al., Future Fab International, 16, (2004).
Caluwaerts et al, "Post Patterning Meso Porosity Creation: A Potential Solution for Pore Sealing," IITC 2003.
Peter Singer, "New Materials and Designs to Improve Transistor Performance", Apr. 1, 2004, Semiconductor International.

(56) References Cited

OTHER PUBLICATIONS

Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
Varadarajan, et al., "Strained Transistor Architecture and Method", Novellus Systems, Inc., U.S. Appl. No. 10/923,259, filed Aug. 20, 2004, pp. 1-24.
Niu et al., "Methods for Improving the Cracking Resistance of Low-K Dielectric Materials", U.S. Appl. No. 10/860,340, filed Jun. 2, 2004.
Niu et al., "Methods for Improving the Cracking Resistance of Low-K Dielectric Materials", U.S. Appl. No. 10/860,340, Office Action dated Mar. 2, 2005.
Niu et al., "Methods for Improving the Cracking Resistance of Low-K Dielectric Materials", U.S. Appl. No. 10/860,340, Final Office Action dated Jun. 13, 2005.
Wang et al., "Plasma Detemplating and Silanol Capping of Porous Dielectric Films", U.S. Appl. No. 10/785,235, filed Feb. 23, 2004.
Varadarajan et al., "Tensile Dielectric Films Using UV Curing", U.S. Appl. No. 10/972,084, filed Oct. 22, 2004.
Fox et al., "Method for Improving Mechanical Properties of Low Dielectric Constant Materials", U.S. Appl. No. 10/849,568, filed May 18, 2004.
Fox et al., "Methods for Producing Low-Stress Carbon-Doped Oxide Films With Improved Integration Properties", U.S. Appl. No. 10/987,208, filed Nov. 12, 2004.
Van Den Hoek et al., "VLSI Fabrication Processes for Introducing Pores Into Dielectric Materials," U.S. Appl. No. 11/050,621, filed Jan. 31, 2005.
Draeger et al., "Creation of Porosity in Low-K Films by Photo-Disassociation of Imbedded Nanoparticles," U.S. Appl. No. 11/146,456, filed Jun. 6, 2005.
Wu et al., "Methods for Producing Low Stress Porous Low-K Dielectric Materials Using Precursors With Organic Functional Groups", U.S. Appl. No. 10/927,777, filed Aug. 27, 2004.
Wu et al., "Methods for Improving Integration Performance of Low Stress CDO Films", U.S. Appl. No. 10/941,502, filed Sep. 14, 2004.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Office Action mailed Jul. 13, 2005, from U.S. Appl. No. 10/672,311.
U.S. Office Action mailed Jul. 27, 2005, from U.S. Appl. No. 10/785,235.
U.S. Office Action mailed Aug. 24, 2005, from U.S. Appl. No. 10/404,693.
U.S. Office Action mailed Sep. 1, 2005, from U.S. Appl. No. 10/672,305.
Cho et al., "Mehtod for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.
U.S. Office Action mailed Dec. 20, 2005, from U.S. Appl. No. 10/672,311.
U.S. Office Action mailed Feb. 7, 2006, from U.S. Appl. No. 10/672,305.
U.S. Office Action mailed Dec. 20, 2005, from U.S. Appl. No. 10/849,568.
U.S. Office Action mailed Jan. 9, 2006, from U.S. Appl. No. 10/785,235.
U.S. Office Action mailed Dec. 27, 2005, from U.S. Appl. No. 10/789,103.
U.S. Office Action mailed Dec. 23, 2005, from U.S. Appl. No. 10/800,409.
Subramonium et al., "Pulsed PECVD Method for Modulating Hydrogen Content in Hard Mask", U.S. Appl. No. 11/318,269, filed Dec. 23, 2005.
U.S. Office Action mailed Feb. 28, 2006, from U.S. Appl. No. 10/404,693.
U.S. Office Action mailed Mar. 29, 2006, from U.S. Appl. No. 10/800,377.
U.S. Office Action mailed May 31, 2006, from U.S. Appl. No. 10/941,502.
U.S. Office Action mailed May 30, 2006, from U.S. Appl. No. 10/785,235.
U.S. Office Action mailed May 31, 2006, from U.S. Appl. No. 10/849,568.
U.S. Office Action mailed May 2, 2006, from U.S. Appl. No. 11/050,621.
U.S. Office Action mailed Jun. 15, 2006, from U.S. Appl. No. 10/800,409.
U.S. Office Action mailed Jun. 28, 2006, from U.S. Appl. No. 10/825,888.
U.S. Office Action mailed May 2, 2006, from U.S. Appl. No. 10/295,965.
U.S. Office Action mailed Aug. 9, 2005, from U.S. Appl. No. 10/295,965.
U.S. Office Action mailed Jun. 14, 2006, from U.S. Appl. No. 10/789,103.
Shrinivasan et al., "Single-Chamber Sequential Curing of Semiconductor Wafers", U.S. Appl. No. 11/115,576, filed Apr. 26, 2005.
Shrinivasan et al., "Cast Pedestal with Heating Element and Coaxial Heat Exchanger", U.S. Appl. No. 11/184,101, filed Jul. 18, 2005.
Schravendijk, et al., "UV Treatment of STI Films for Stress," Novellus Systems, Inc., U.S. Appl. No. 11/811,048, filed Jun. 7, 2007.
Arghavani et al., Strain Engineering in Non-Volatile Memories, *Reed Business Information*, 2007, six pages.
Notice of Allowance and Fee Due mailed Apr. 4, 2007, from U.S. Appl. No. 10/825,888.
Allowed Claims from U.S. Appl. No. 10/825,888, filed Apr. 16, 2004.
Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.
Notice of Allowance and Fee Due mailed Oct. 10, 2006, from U.S. Appl. No. 10/800,377.
Allowed Claims from U.S. Appl. No. 10/800,377, filed Mar. 11, 2004.
Notice of Allowance and Fee Due mailed Dec. 20, 2005, from U.S. Appl. No. 10/860,340.
Allowed Claims from U.S. Appl. No. 10/860,340, filed Jun. 2, 2004.
U.S. Office Action mailed Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. $68^{th}$ Symp. on Semiconductors and IC Tech.; Kyoto 2005.
U.S. Final Office Action mailed Apr. 3, 2008, from U.S. Appl. No. 10/982,654.
U.S. Office Action mailed Jun. 27, 2008, from U.S. Appl. No. 11/280,113.
U.S. Final Office Action mailed Jul. 9, 2008, from U.S. Appl. No. 10/982,654.
U.S. Final Office Action mailed Mar. 18, 2008, from U.S. Appl. No. 10/404,693.
U.S. Final Office Action mailed Jul. 10, 2008, from U.S. Appl. No. 10/807,680.

(56) References Cited

OTHER PUBLICATIONS

U.S. Final Office Action mailed Jul. 25, 2008, from U.S. Appl. No. 11/146,456.
Notice of Allowance mailed Nov. 10, 2008, from U.S. Appl. No. 11/146,456.
Supplemental Notice of Allowance mailed Nov. 10, 2008, from U.S. Appl. No. 11/146,456.
U.S. Office Action mailed Dec. 4, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/115,576, Office Action mailed Apr. 22, 2009.
U.S. Appl. No. 11/280,113 Office Action mailed Feb. 4, 2009.
U.S. Office Action mailed Feb. 5, 2009, from U.S. Appl. No. 11/606,340.
Draeger et al., "Creation of Porosity in Low-K Films by Photo-Disassociation of Imbedded Nanoparticles," U.S. Appl. No. 12/369,384, filed Feb. 11, 2009.
Shrinivassan et al., "Multi-Station Sequential Curing of Dielectric Films," U.S. Appl. No. 14/086,732, filed Nov. 21, 2013.
U.S. Examiner's Answer to Appeal Brief (filed Nov. 20, 2013) Before the Patent Trial and Appeal Board on Mar. 13, 2014 issued in U.S. Appl. No. 10/972,084.
U.S. 2nd or Subsequent Examiner's Answer to Appeal Brief (filed Nov. 20, 2013) Before the Patent Trial and Appeal Board on Apr. 2, 2014 issued in U.S. Appl. No. 10/972,084.
U.S. Office Action dated Feb. 25, 2014 issued in U.S. Appl. No. 11/977,792.
U.S. Office Action dated Mar. 31, 2014 issued in U.S. Appl. No. 14/026,894.
U.S. Office Action dated Apr. 24, 2014 issued in U.S. Appl. No. 12/210,060.
U.S. Office Action dated Feb. 20, 2014 issued in U.S. Appl. No. 12/646,830.

\* cited by examiner

METHOD FOR REDUCING STRESS IN POROUS DIELECTRIC FILMS

CROSS-REFERENCE TO RELATED APPLICATIONS

This application is a continuation-in-part claiming priority under 35 USC 120 from U.S. patent application Ser. No. 11/115,576, filed on Apr. 26, 2005, titled "Single-Chamber Sequential Curing Of Semiconductor Wafers," which application is incorporated herein by reference in its entirety for all purposes. This application is also related to U.S. patent application Ser. No. 10/672,311, filed on Sep. 26, 2003, titled "Method of Porogen Removal From Porous Low-k Films Using UV Radiation," which application is also incorporated herein by reference in its entirety for all purposes.

FIELD OF THE INVENTION

This invention relates to methods for preparing and treating dielectric films. More specifically, the invention relates to exposing films to ultraviolet radiation to facilitate porogen removal from a precursor film and/or obtaining desired mechanical properties of the dielectric film.

BACKGROUND

There is a general need for materials with low dielectric constants (low-k) in the integrated circuit manufacturing industry. Using low-k materials as the intermetal and/or interlayer dielectric of conductive interconnects reduces the delay in signal propagation due to capacitive effects. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is k<~4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film include, for example, a thermal process in which the substrate is heated to a temperature sufficient for the breakdown and vaporization of the organic porogen. These thermal processes, however, have certain difficulties. In particular, substrate temperatures generally need to be high (i.e. greater than about 400 degrees Celsius) with exposure times typically on the order of hours. As is well known in the field, these conditions can damage copper containing devices. Another technique involves exposing the film to UV radiation. These processes however may result in high thin film stress in the dielectric, which may be inappropriate for some applications.

What are needed therefore are improved methods for removing porogen to form porous films. Methods of removing porogen to form porous films having high hardness and low stress are particularly needed.

SUMMARY

The present invention addresses this need by providing improved methods of preparing a low-k dielectric material on a substrate. The methods involve multi-step ultraviolet curing processes in which UV intensity, wafer substrate temperature and other conditions may be independently modulated at each step. In certain embodiments, a film containing a structure former and a porogen is exposed to UV radiation in a first step to facilitate removal of the porogen and create a porous dielectric film. In a second step, the film is exposed to UV radiation to increase crosslinking within the porous film. In certain embodiments, the curing takes place in a multi-station UV chamber wherein UV intensity, spectral distribution and substrate temperature may be independently controlled at each station.

BRIEF DESCRIPTION OF THE DRAWINGS

The following detailed description can be more fully understood when considered in conjunction with the drawings in which.

DETAILED DESCRIPTION OF A PREFERRED EMBODIMENT

Introduction

Figure 1:
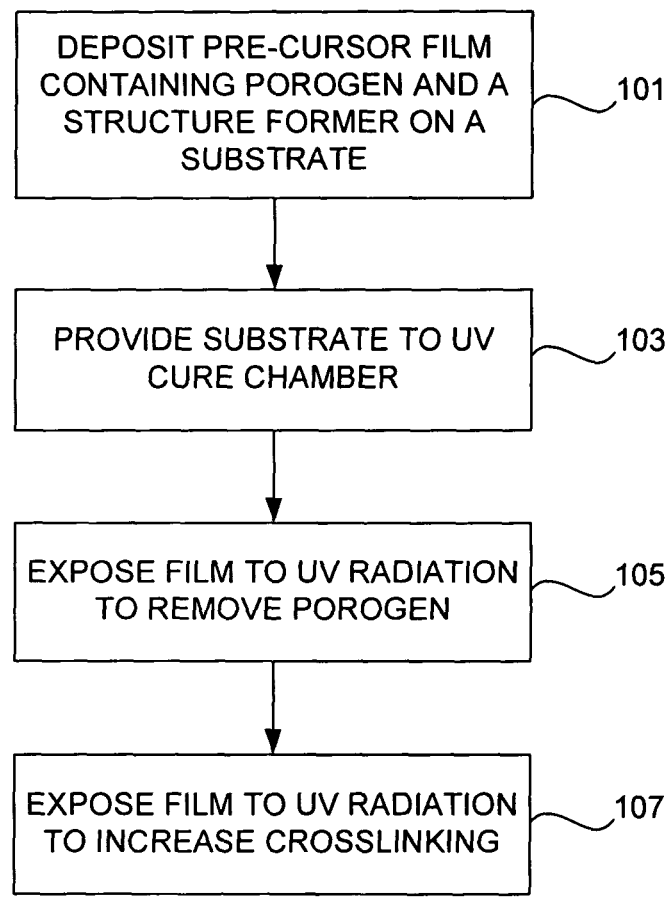
FIG. 1 is a flowchart summarizing stages of a general process in accordance with the present invention.

In the following description, numerous specific details are set forth in order to provide a thorough understanding of the present invention, which pertains to porogen removal of a porous precursor film. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves processes to prepare and/or cure dielectric films on substrates by exposure to UV radiation. Effects of exposure to UV radiation or UV curing may include increased stress of the materials, increased crosslinking of the bonds of the material and densification the material. UV radiation is also used to remove porogen from a precursor layer containing a porogen and structure former or backbone, thereby forming a porous dielectric film. It is often desirable to modulate one or more of these effects in preference to one another—for example, for dense low-k carbon-doped oxide films, it is desirable to increase the mechanical properties of the films by crosslinking without a large increase in the stress of the film whereas for silicon nitride films, a large increase in the stress may be desirable. Similarly, in preparing porous low-k films from precursor layers, it may be desirable to remove porogen from a precursor layer and strengthen the backbone without a concomitant increase in stress.

Conventional UV curing processes use a single processing condition, e.g. 100% UV intensity and temperature of 400°

C., that may be suitable for one or some of the effects listed above but may also cause an undesired effect. Methods of the invention modulate these effects in preference to one another. In certain embodiments, the methods involve multi-step cure processes, each step having a particular desired result or effect, with conditions such as UV intensity and substrate temperature optimized for the particular desired result. Also in certain embodiments, optimizing conditions for a desired effect involves independently controlling the UV intensity and the substrate temperature at each step (i.e., so that the substrate temperature is decoupled from the UV intensity). The methods of the invention may be performed multi-station cure chambers, each station having a UV light source, and conditions at each station optimized for the desired result at that station.

As discussed above, UV curing is used to drive out porogen from composite porogen-OSG films, leaving a porous OSG matrix with a low k-value, generally between 2.0 and 2.6. In a particular embodiment, the methods of the present invention are used to prepare dielectric films from precursor films or layers that contain a structure former that serves as a backbone of a porous network, and a porogen, which generates the porous regions within the porous network. The methods involve a multi-step UV cure process in which porogen is removed in an initial exposure (or exposures) to UV radiation to form a porous dielectric film. This operation tends to make the film softer. Once the porogen is removed, the film is exposed to UV radiation to increase crosslinking within the film, thereby increasing the hardness. Films produced by these methods have lower stress than films produced using a single step cure, while having comparable hardness and modulus as those films.

FIG. 1 is a flow chart depicting operations in one method of removing porogen and strengthening a porous dielectric film. Initially, a precursor film is provided on a substrate as indicated by an operation 101. As mentioned previously, a precursor film contains a porogen and a structure former for the dielectric backbone. In an operation 103, the substrate is provided to a UV cure chamber. In a particular embodiment, the UV cure chamber contains multiple stations each of which is equipped with a UV light source. The substrate is initially provided to one of the stations for exposure to UV radiation in an operation 105. In an operation 105, the precursor film is exposed to UV radiation to mediate removal of at least a portion of the porogen to leave a porous dielectric film. Conditions including UV intensity and substrate temperature are optimized during exposure for porogen removal. Then, at an operation 107, the precursor film is exposed to UV radiation to increase crosslinking within the porous dielectric film. If a multi-station chamber is used, exposure in operation 107 may involve advancing the substrate is advanced from the initial station to a second station. UV intensity and/or substrate temperature in operation 107 are optimized for increasing crosslinking. In certain embodiments, the UV intensity and/or substrate temperature are optimized for increasing crosslinking and minimizing stress increase during exposure to the UV radiation.

In certain embodiments, the UV cure processes described herein improve wafer throughput by reducing UV exposure time and/or parallel processing of wafers. For example, in one embodiment, using a thermal anneal for the porogen removal step reduces required UV exposure time to harden the film by 75% resulting in a three-fold improvement in wafer throughput in the UV cure station.

Reference is made throughout the specification to multi-step operations in which porogen is removed from a precursor film in an initial operation or operations, and crosslinking (and hardness) is increased in a subsequent operation or operations and for which temperature and UV intensity differentiate the porogen removal and crosslinking operations. As indicated, these processes may be used to produce low stress porous dielectric film having mechanical strength. However, the multi-step operations may also be used for other UV curing processes in which both temperature and/or UV intensity differ from stage to stage to increase any of the effects of UV radiation (porogen removal, crosslinking, stress, etc.) in preference to any other effect.

Forming the Precursor Film

Certain embodiments of the present invention involve forming a low-k dielectric material by way of a precursor film or layer that contains a "structure former", typically a dielectric material, which serves as a backbone of the porous network, and a porogen, which generates the porous regions within the porous network. Hence, the porogen and dielectric matrix typically exist as separate phases within the precursor layer. In methods of this invention, the porogen is removed from the precursor film to create a porous low-k dielectric layer. Within the precursor film, the porogen resides in locations that will subsequently become void locations in the final dielectric film.

The precursor film may be formed by any of numerous techniques. In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the precursor film may range between about 15 nanometers and 3 micrometers.

Generally, a porogen is any removable material that defines void regions in a dielectric matrix. Frequently, though not necessarily, the porogen is an organic material. In methods of the present invention, the porogen is removed from the precursor film by a UV mediated method. In a first approach, the UV light directly interacts with the porogen to chemically decompose or otherwise modify the porogen and produce products that are more easily removed than the porogen itself. In another approach, the UV exposure occurs in the presence of oxygen to create an oxidizing environment (e.g., ozone and/or oxygen radicals) that oxidizes the porogen. The oxidation products are more easily removed than the porogen itself. Note that in this approach, some UV radiation may interact directly with the porogen as well. In general, the UV radiation is tuned for absorption by the porogen in the first approach and tuned for oxygen activation in the second approach. Thus, in the first approach, the UV radiation preferably has a high intensity component at a wavelength (or range of wavelengths) at or near an absorption peak of the porogen. Of course, the porogen may be chosen to match the characteristics of an available UV source.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. The following is a non-comprehensive list of precursor films (listed by type of porogen molecules) suitable for the present invention. "Low temperature porogens" are deposited below about 200 degrees C. and "high temperature porogens" are deposited above about 200 degree C.

| Low Temperature Porogens | High Temperature Porogens |
| --- | --- |
| Aldehydes: CH2O, CH3CHO<br>Alkenes: C2H4,<br>CH3—CH=CH2, etc<br>di-tert-butyl silane<br>Esters | Alkenes: C2H4,<br>CH3—CH=CH2, etc<br>Terpene family compounds<br>(e.g. alpha-terpinene)<br>Terpene derivatives (such as terpinol)<br>Compounds with multiple active sites<br>(e.g., ENB) |

One preferred class of porogens is the polyfunctional cyclic non-aromatic compounds, particularly alpha-terpinenes (ATRP). Suitable alpha-terpinene derivatives include, for example, alpha-terpinene itself, substituted alpha-terpinenes, and multi-ring compounds containing the alpha-terpinene nucleus. Other compounds include functional groups such as —CH=CH$_2$, —CH=CH—, —C≡CH, —C≡C—, —C=O, —OCH$_3$. A typical example of these compounds is 1,2,3,4-tetramethyl-1,3-cyclopentadiene (TMCP) (C$_9$H$_{14}$). Three-dimensional multi-ring compounds such as 5-ethylidene-2-norbornene (ENB) are also suitable. Another ATRP compound that is preferred is D-limonene.

In some cases, the porogen and structure former reside in the same compound. That is, the porogen is a removable moiety in a compound that contains moieties serving as structure formers covalently bonded to moieties serving as the porogen. Nominally, the porogen moiety is a large bulky organic substituent that will leave pores in the resulting dielectric film. Examples of such species are organic silanes such as di-tert-butylsilane, phenyldimethylsilane, and alkoxysilanes such as 5-(bicycloheptenyl)methyldimethoxysilane (BMDS) and 5-(bicycloheptenyl)triethoxysilane (BTS) (SiC$_{13}$O$_3$H$_{24}$). These compounds may be deposited using CVD or spin on methods, for example.

As indicated, the structure former serves as a backbone for the resulting porous low-k film. Many different chemical compositions may be used as the structure former. In some embodiments, the composition includes silicon and oxygen. Sometimes it also includes carbon and/or other elements and even metals. For relatively thick precursor layers, it will sometimes be desirable to use structure formers that are not opaque to the UV radiation.

Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). Note that one example of a silane is di-tert-butylsilane, described above.

The thickness of the precursor film (and hence the resulting dielectric layer) depends upon the ultimate application. For an interlayer dielectric or packaging application, the thickness may range from 100 angstroms up to about 2 to 3 microns. In some cases, extra thickness is required to provide some amount of sacrificial dielectric to accommodate a subsequent planarization step. In some cases, the thickness of the precursor layer may be driven in part by the ability of the UV radiation to penetrate the film and remove the porogen. Therefore relatively thinner precursor layers may be required for some processes.

Porogen Removal

The porogen removal operation may be accomplished by thermal anneal, UV radiation, or a combination of both. It will be appreciated by those skilled in the art that the UV radiation used with the invention encompasses near-UV, as well UV wavelengths. Thus, the radiation used to facilitate porogen removal in accordance with this invention may have wavelengths ranging between about 156 and 500 nanometers. As indicated, the UV wavelength(s) should match the absorption characteristics of the porogen bonds to be broken and/or the oxidizing agent, if used. Common bonds to be targeted which contribute to the overall absorption characteristics of the porogen-containing film are Si—CH$_3$, C—C, C=C and C—H. For example, ATRP has an absorption peak at approximately 250 nanometers; therefore, a UV source intended to interact directly with a film containing ATRP preferably has high intensity components in the range of about 220 to 285 nanometers. Note that the radiation may comprise a narrow range of wavelengths (e.g., most intensity exits in a band of about 1 to 20 nanometers) or a broader range of wavelengths.

As indicated, the UV light can directly interact with porogen bonds and thereby facilitate its decomposition or other breakdown mechanism. In a typical case, the porogen decomposes into lower molecular weight components that exist in the vapor phase or can be easily vaporized and thereby removed from the precursor film. Alternatively the UV radiation can indirectly facilitate breakdown of the porogen. In one example, this is accomplished by the UV radiation interacting with a compound other than the porogen to convert that compound into a species that can attack the porogen and thereby facilitate its removal. For example, the UV radiation may convert molecular oxygen or other oxygen containing compounds present in a reaction chamber to produce a strong oxidant, which can then react with and break down the porogen. Again, the decomposition products of the porogen can be volatilized and removed from the precursor film.

In embodiments wherein UV radiation is used to remove porogen, one or more of substrate temperature, UV intensity and UV wavelength are set to result in porogen removal while minimizing the increase in the stress of the film. As discussed above, the single conventional cure step, e.g., at 400 C and 100% UV intensity, used for porogen removal and increasing hardness results in an increase in stress. In certain embodiments of this invention, the porogen removal operation is performed at a lower UV intensity and/or lower temperature than subsequent crosslinking operations.

Temperatures during the porogen removal step may be from around 250 C-450 C. As indicated, in some embodiments the temperature during the porogen removal step is lower than the temperature during the crosslinking step. For example, the temperature during the porogen removal step may range from about 250 C-350; in specific embodiments the temperature ranges from about 300 C-350 C, about 300 C-325 C, and about 325 C-350 C. In one particular embodiment, the temperature is about 325 C during the porogen removal operation. As discussed below, temperatures during the crosslinking operation may be around 400 C or greater.

Also in certain embodiments, UV intensity is lower than during the crosslinking step. For example, UV intensity may be from about 0-60%, 0-70%, 0-80% or 0-90% than it is during the crosslinking operation. In a specific embodiment, UV intensity is about 50-90% the intensity during the crosslinking operation.

In some embodiments, the porogen removal step may be accomplished by a thermal anneal (i.e., with zero UV intensity). Temperatures required for purely thermal anneal depend on the particular porogen used. Typical temperatures range from around 300 C-450 C, e.g., around 400 C. The use of a thermal cure alone to remove porogen may be beneficial to reduce the total time of UV exposure.

In certain embodiments, both substrate temperature and UV intensity are lower during the porogen removal operation than for subsequent crosslinking operations. Unlike in a conventional single step UV cure process, conditions during the porogen removal operation are such that the film is typically made softer or more compliant as a result of this operation. In certain embodiments, the UV intensity is the same or higher during the porogen removal process as during subsequent crosslinking operations. For example, in some embodiment, temperature but not UV intensity may be constant during porogen removal and crosslinking operations. In other embodiments, UV intensity may be constant (e.g., at 100%) for porogen removal and crosslinking operations, with temperature lower during the porogen removal operation.

Figure 2:
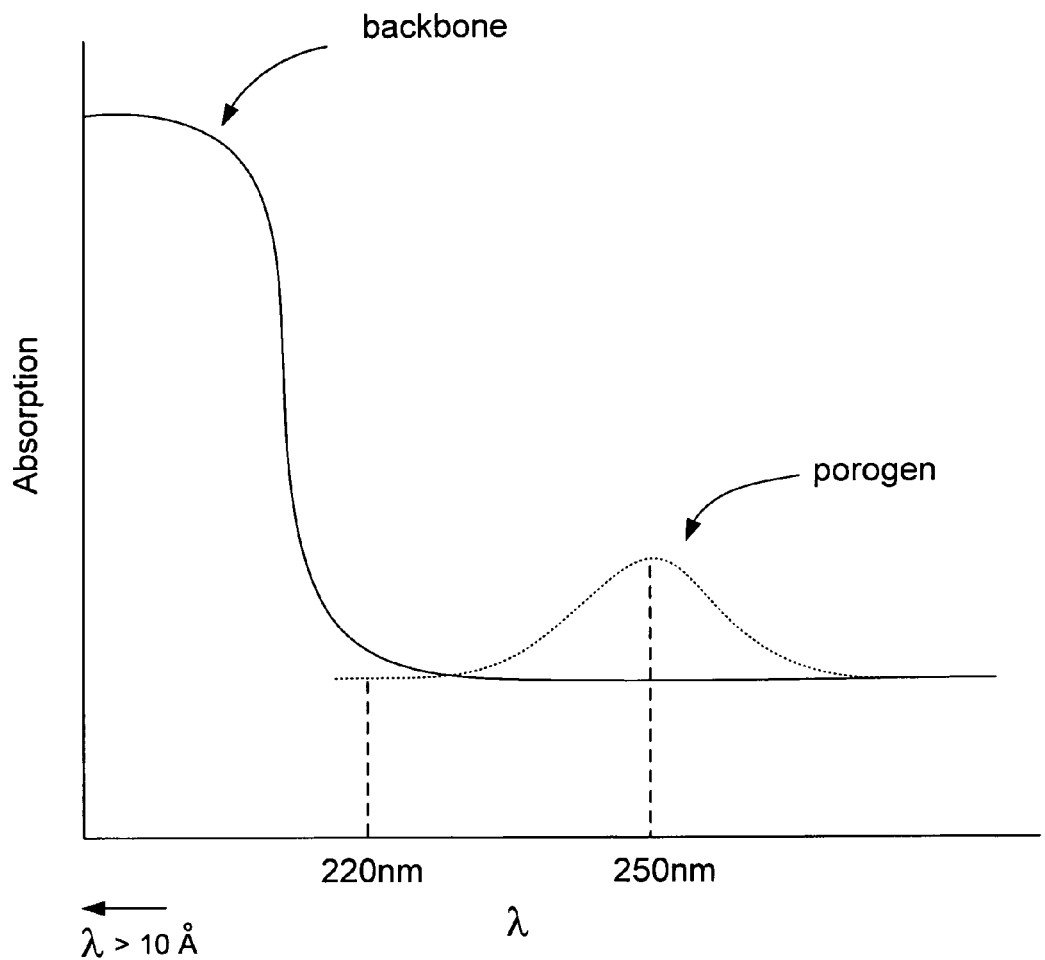
FIG. 2 is a rough schematic representing UV absorption as a function of wavelength for certain processes in accordance with the present invention.

In certain embodiments, conditions during the porogen removal operation and the crosslinking operation or operations are also differentiated by the wavelength of the UV radiation. FIG. 2 shows a rough schematic of UV absorption as a function of wavelength for a porogen and crosslinking in a dielectric material. As can be seen from the figure, absorption of radiation by the backbone is highest at lower wavelengths, including wavelengths as low as around 10 angstroms, and decreases around higher wavelengths. Absorption of radiation by the porogen is dependent on the particular porogen used; the porogen shown in FIG. 2 has an absorption peak around 250 nm. It should be noted that the absorption spectra depicted are examples; the absorption spectra of the porogen and backbone depends on the particular compositions. In certain embodiments, a first station of a multi-station cure chamber has a radiation source emitting radiation of wavelengths of common porogens, e.g., around 200 nm-500 nm, 200 nm-280 nm, or around 250 nm, while other stations dedicated to increasing the mechanical strength of the porogen have radiation sources that emit lower wavelength radiation.

UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes. Purely thermal porogen removal operations may take longer, e.g., hours to tens of hours.

As indicated the UV radiation may directly interact with the porogen or it may generate a reactive species that in turn attacks the porogen. If the exclusive mechanism is direct interaction, then the porogen removal operation is preferably performed an inert environment. This may be a vacuum, a noble gas atmosphere (e.g., argon, helium, and/or xenon), a nitrogen atmosphere, etc. In some embodiments, a quantity of hydrogen gas is used as well. If reactive species are to be generated, then the atmosphere could include oxygen, $N_2O$, $CO_2$, $NO_2$ or a combination thereof. When exposed to UV radiation, molecular diatomic oxygen forms less stable but more aggressive oxidizing species such as ozone and oxygen radicals. The ozone and oxygen radicals are sufficiently strong oxidizing agents to oxidize the organic porogen. The porogen is then removed in the form of small volatile hydrocarbon molecules and oxygen containing species. Additional gases during UV exposure for porogen removal could include F-containing species. F radicals generated during UV exposure react and decompose CH compounds in the film. Examples of this class of gases include $C_2F_6$, $C_3F_8$, $NF_3$, etc.

UV-mediated porogen removal is also discussed in commonly assigned U.S. patent application Ser. No. 10/672,311, filed Sep. 26, 2003 and titled METHOD OF POROGEN REMOVAL FROM POROUS LOW-K FILMS USING UV RADIATION, which is hereby incorporated by reference in its entirety.

Crosslinking

As noted above, after the porogen removal operation, the film is typical soft and compliant. The crosslinking operation increases the hardness and/or modulus of the film. The crosslinking operation is so called because it is believed that it increases the number of crosslinks (i.e., the number of covalent bonds) within the dielectric film, thereby increasing the film hardness. However, the invention is not limited to a particular mechanism of increasing the hardness and modulus. Hardness and modulus are well defined within the art and will not be discussed in detail herein. Measures of film hardness and modulus presented herein may be made with any suitable apparatus including nano-indenter device.

One way to characterize mechanical performance of a dielectric film is via a "cracking threshold" measurement. This is a measure of thickness of a dielectric film on a blank substrate (e.g., a flat 300 mm wafer) that can be deposited without forming a crack. In a typical experiment, the dielectric is deposited to various thicknesses using a single set of process conditions. The resulting wafer (with dielectric film) is set aside without disturbance for a period of time (e.g., one day) and then examined for cracks. The greatest thickness at which no crack is observed is the cracking threshold. For many processes, the cracking threshold is measured in micrometers. The cracking threshold as well as crack propagation velocity in dielectric films is exponentially dependent on film stress. Thus it is important to minimize thin film stresses to prevent crack propagation through the dielectric layer during the packaging process. As indicated above, in certain embodiments, multi-operation porogen removal and curing operations of the present invention result in minimizing the stress of the film.

The crosslinking operation is performed by exposing the porous dielectric film to radiation. In certain embodiments, the film is exposed to ultraviolet radiation. However, as noted above, radiation having wavelengths as low as 10 angstroms may be used to increase crosslinking.

Substrate temperatures may range from around room temperature to about 450 C, for example around 400 C. As indicated, in certain embodiments, substrate temperatures during the crosslinking operation are typically higher than during porogen removal. In a particular embodiment, substrate temperature during porogen removal is about 325 C, and during the crosslinking operation around 400 C. In some embodiments, substrate temperature during the crosslinking operation or operations may be as high as the thermal budget allows.

UV intensity may also be higher during crosslinking than during porogen removal, as discussed above. UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes.

The UV radiation during the crosslinking step may be modulated, e.g., by intensity, to facilitate mechanical strengthening. This is described in the commonly assigned U.S. patent application Ser. No. 10/825,888, filed Apr. 16, 2004 and titled "Method To Improve Mechanical Strength Of Low-K Dielectric Film Using Modulated UV Exposure," which is hereby incorporated by reference in its entirety.

As explained in the reference, the modulation may be introduced by any of many different mechanisms for controlling the UV radiation delivered to the work piece. Examples include controlling UV source power, controlling mechanical barriers (e.g., an aperture or rotating chopper) between the UV source and the substrate, and controlling an optical element (e.g., a filter, lens, or mirror) between the source and the substrate.

Apparatus

The present invention can be implemented in many different types of apparatus. Generally, the apparatus will include one or more chambers (sometimes referred to as process vessels) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g., rotation, vibration, or other agitation) during porogen removal and crosslinking operations. For certain operations in which the wafer is to be heated, the apparatus may include a heating platen.

In certain embodiments the multi-operation cure process is performed using a multi-station cure chamber. As discussed above, in certain embodiments, the multi-step cure processes of the invention rely on being able to independently modulate the UV intensity, wavelength, spectral distribution and substrate temperature of each step or operation. For example, in one embodiment, the porogen removal operation uses the same UV intensity but a lower substrate temperature than the crosslinking operation. In another embodiment, the porogen removal operation uses a lower substrate temperature and a lower UV intensity than the crosslinking operation. Similarly, various effects of UV exposure (porogen removal, change in stress, change in hardness, process time, etc.) may be modulated by independently modulating UV intensity and substrate temperature.

Multi-station cure chambers capable of modulating these effects by providing independent control of the substrate temperature and the UV intensity are described in above-referenced U.S. patent application Ser. No. 11/115,576 and in commonly assigned U.S. patent application Ser. No. 11/184,101, filed Jul. 18, 2005, titled "Cast Pedestal With Heating Element and Coaxial Heat Exchanger," which is hereby incorporated by reference in its entirety and for all purposes.

These chambers decouple substrate temperature and UV intensity by reducing the amount of IR radiation on the wafer and/or providing independent heat transfer mechanisms to and from the wafer. For example, the chambers may be equipped with cold mirrors or other reflectors to reduce the amount of IR radiation incident on the wafer. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figure 3A:
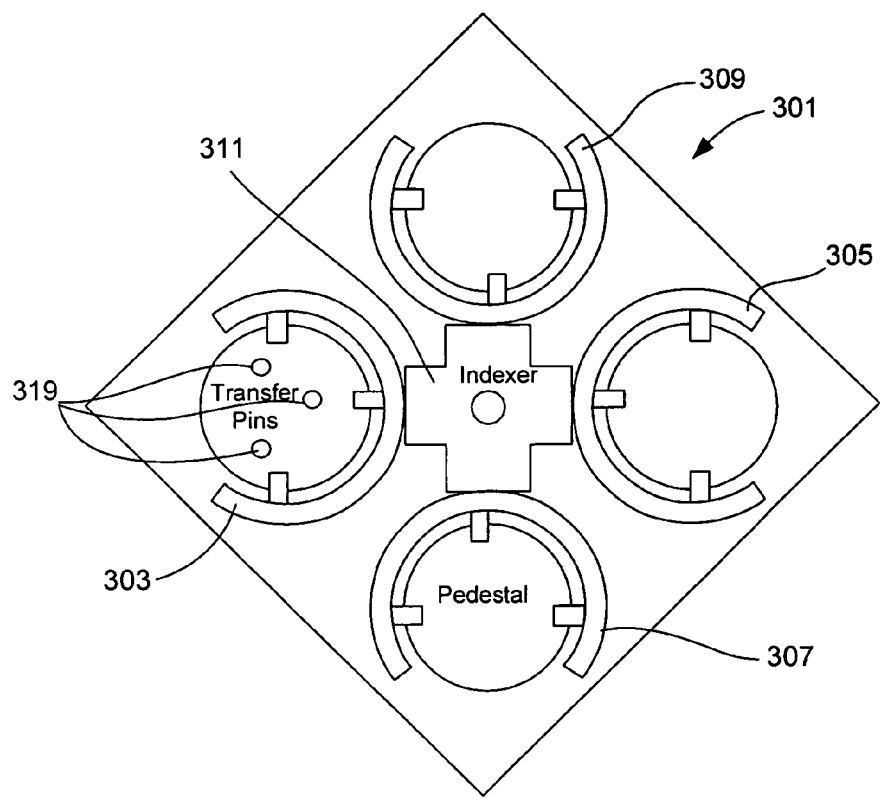
FIGS. 3a and b are schematic representations of an apparatus suitable for UV porogen removal in accordance with certain embodiments of this invention.
Figure 3B:
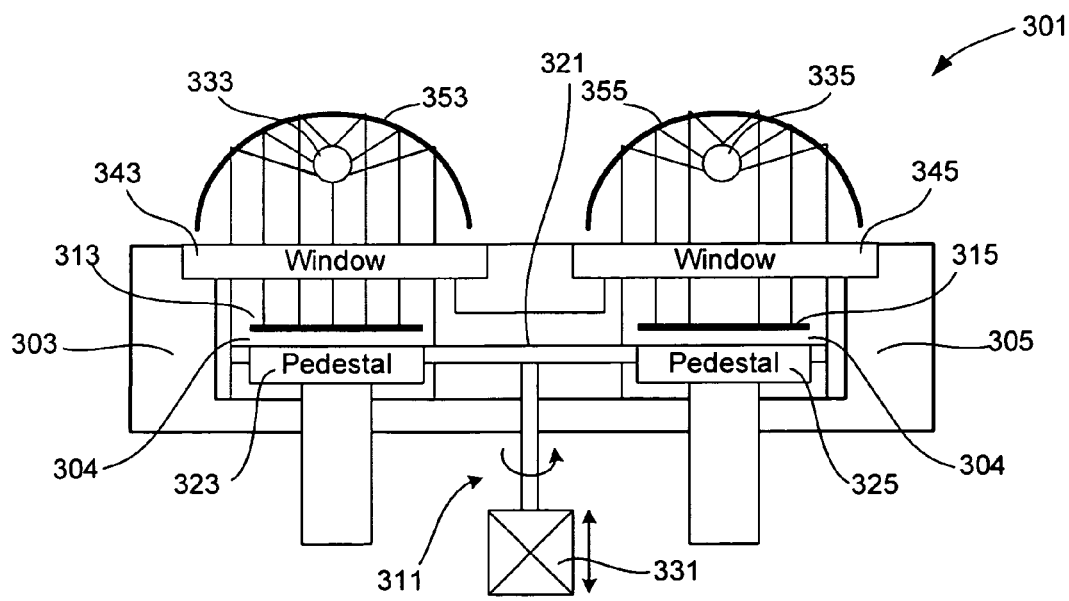

FIGS. 3a and 3b show one embodiment of an apparatus appropriate for use with certain embodiments of the invention that uses UV flood lamps. Chamber 301 includes multiple cure stations 303, 305, 307 and 309, each of which accommodates a wafer. Station 303 includes transfer pins 319. FIG. 3b is a side view of the chamber showing stations 303 and 305 and wafers 313 and 315 located above pedestals 323 and 325. There are gaps 304 between the wafers and the pedestals. The wafer may be supported above the pedestal by an attachment, such as a pin, or floated on gas. Parabolic cold mirrors 353 and 355 are located above UV flood lamp sets 333 and 335. UV light from lamp sets 333 and 335 passes through windows 343 and 345. Wafers 303 and 305 are then exposed to the radiation. In alternative embodiments, the wafer may be supported by the pedestals 323 and 325. In such embodiments, the lamps may or may not be equipped with cold mirrors. By making full contact with the pedestal, the wafer temperature may be maintained by use of a conductive gas such as helium at a sufficiently high pressure, typically between 50 and 760 Torr, but preferably between 100 and 600 Torr.

In operation, a wafer (or other substrate) enters the chamber at station 303 where the porogen removal operation is performed. Pedestal temperature at station 303 is set to a first temperature, e.g. 325° C., with the UV lamps above station 303 set to a first intensity, e.g., 60% maximum intensity. After having some or all of the porogen removed in station 303, the porous dielectric matrix is soft and is transferred to station 305 for hardening. Pedestal temperature at station 305 is set to a second temperature, e.g., 400° C. and UV intensity is set to a second intensity, e.g. 100% maximum intensity. Stations 407 and 409 may also be used for increasing hardness. For example, conditions at stations 305, 307 and 309 may be the same. Each wafer is sequentially exposed to each UV light source In the example show in FIG. 3b, pedestals 323 and 325 are stationary. Indexer 311 lifts and moves each wafer from one pedestal to another between each exposure period. Indexer 311 is an indexer plate 321 attached to a motion mechanism 331 that has rotational and axial motion. Upward axial motion is imparted to indexer plate 321 to pick up wafers from each pedestal. The rotational motion serves to advance the wafers from one station to another. The motion mechanism then imparts downward axial motion to the plate to put the wafers down on the stations.

Pedestals 323 and 325 are electrically heated and maintained at a desired process temperature. Pedestals 323 and 325 may also be equipped with cooling lines, if needed. Each pedestal may have its own heating system. In an alternate embodiment, a large heater block may be used to support the wafers instead of individual pedestals. A thermally conductive gas, such as helium, is used to effect good thermal coupling between the pedestal and the wafer. In some embodiments, cast pedestals with coaxial heat exchangers may be used. These are described in above-referenced application Ser. No. 11/184,101.

FIGS. 3a and 3b show only an example of a suitable apparatus and other apparatuses designed for other methods involved in previous and/or subsequent processes may be used. For example, in another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively the carousel may be in contact with a heater plate or hold the wafers so that they are suspended above a heater plate.

In certain embodiments, the substrates are exposed to UV radiation from focused, rather than, flood lamps. Unlike the flood lamp embodiments wherein the wafers are stationary during exposure (as in FIGS. 3a and b), there is relative movement between the wafers and the light sources during exposure to the focused lights as the wafers are scanned.

Also in certain embodiments, the types of lamps and the spectral distribution of the UV radiation may differ at one or more stations. Different types of UV lamps have different distributions.

Other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source. Many of these systems may also be used to perform post-porogen removal procedures. In these cases, the chamber system will likely be pumped out between each of the process steps.

EXAMPLES

Ultra-low k Coral films (k=2.5) are typically cured using a conventional curing process with the film exposed to the maximum UV intensity generated by the lamps and wafer temperature of 400° C. This curing process results increases the film stress by 27-29 MPa to generate a film with k of 2.5 and hardness of about 1.2 GPa and a modulus of about 8-8.5 GPa.

In a first example, an as-deposited (porogen+backbone) wafer with a ~1 micrometer thick film was thermally cured at temperatures from 350° C. to 430° C. in a nitrogen ambient for 12 hours. As a result of this cure step, a significant fraction of the porogen (35-50%) was removed from the film. At the same time, the film modulus decreased from about 7 GPa to about 5 GPa. After the thermal treatment, the ultra-low k film was exposed to a shortened cure process where the wafer was heated to 400° C. and exposed to maximum UV intensity for 9 minutes, which is 25% of the process time used during a single step treatment process. As a result of the second step, the film modulus increased to about 8 GPa with a k of about 2.5. Unlike the single-step cure where the stress is increased by about 27-29 MPa, the two-step cure resulted in a stress increase of 20-22 MPa—an improvement of 5-7 MPa over the single step process.

In a second example, an as-deposited wafer was subjected to a first cure step with wafer temperature at 325° C. and UV intensity at about 60% for 2-10 minutes. During the second step of the cure, the wafer was exposed to maximum UV intensity at a temperature of 400 C for the remainder of the standard UV exposure time. This process resulted in a similar reduction in film stress as observed for the thermal anneal+ UV cure process in the first example with similar hardness/ modulus properties.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of preparing a porous low-k dielectric material on a substrate, the method comprising:
   (a) providing a substrate having a precursor film thereon, the precursor film comprising a porogen and a structure former, wherein the precursor film is formed on the substrate through a vapor deposition method;
   (b) exposing the precursor film to ultraviolet radiation at a first UV power, wherein the ultraviolet radiation at the first UV power preferentially acts to perform porogen removal over cross-linking and thereby create voids within the dielectric material to form the porous low-k dielectric material; and
   (c) exposing the dielectric material to ultraviolet radiation at a second UV bower to increase cross-linking within the dielectric material, wherein the second UV power is greater than the first UV power.

2. The method of claim 1 wherein the substrate temperature during (b) differs from the substrate temperature during (c).

3. The method of claim 1 wherein the UV power during (b) is between about 50-90% the UV power during (c).

4. The method of claim 1 wherein the UV power during (b) is about 60% the UV power during (c).

5. The method of claim 1 wherein substrate temperature during (b) is between about 300° C. and 350° C.

6. The method of claim 1 wherein the substrate temperature during (c) is greater than or equal to about 400° C.

7. The method of claim 1 wherein the range of wavelengths of the ultraviolet radiation during (b) differs from the range of wavelengths of the ultraviolet radiation during (c).

8. The method of claim 1 wherein the substrate temperature during (b) and (c) is the same.

9. The method of claim 1 wherein (b) and (c) occur in different stations in a multi-station chamber.

10. A method of preparing a low-k material on a substrate, the method comprising:
    (a) providing a precursor film on the substrate, the precursor film comprising a porogen and a structure former, wherein the precursor film is formed on the substrate through a vapor deposition method;
    (b) providing the substrate to a chamber having a plurality of UV light sources;
    (c) positioning the substrate under a first UV light source in the chamber;
    (d) removing at least a substantial amount of the porogen by exposing the film to radiation from the first UV light source;
    (e) transferring the substrate for exposure to a second UV light source in the chamber;
    (f) exposing the material on the substrate to radiation from the second UV light source to increase crosslinking within the structure former, wherein at least one of a substrate temperature and UV power is greater in (f) than in (d) and wherein the chamber is a multi-station chamber and the first and second UV light sources are each located in different stations of the multi-station chamber.

11. The method of claim 10 wherein the first UV light source supplies UV radiation having a different range of wavelengths than the radiation supplied by the second UV light source.

12. The method of claim 10 wherein the UV power in (d) is less than the UV power in (f).

13. The method of claim 10 wherein the UV power in (d) is between about 50-90% the UV power in (f).

14. The method of claim 10 wherein the substrate temperature in (d) is less than the substrate temperature in (f).

15. The method of claim 10 wherein the substrate temperature in (d) is between about 300° C. and 350° C. and the substrate temperature in (f) is greater than or equal to about 400° C.

16. The method of claim 10 wherein the UV power in (d) is less than the UV power in (f) and the substrate temperature in (d) is the same as in (f).

17. The method of claim 10 wherein the UV light sources are flood lamp sets.

18. The method of claim 10 wherein the UV light sources are focused lamp sets.

19. The method of claim 10 wherein the UV light sources are each equipped with an elliptical cold mirror.

20. A method of treating a low-k porogen-containing material on a substrate, the method comprising:
providing the substrate to a chamber having a plurality of UV light sources, wherein the low-k porogen-containing material is formed on the substrate through a vapor deposition method;
exposing the material on the substrate to a first UV light source to thereby remove a substantial amount of porogen from the low-k material, wherein the first UV light source is at a first UV power and the substrate is at a first temperature; and
after exposing the material on the substrate to the first UV light source, exposing the material on the substrate to a second UV light source, wherein the second UV light source is at a second UV power and the substrate is at a second temperature and wherein the first and second UV powers are different and the first and second temperatures are different, and further wherein the second UV power is greater than the first UV power and the second temperature is greater than the first temperature.

21. The method of claim 20 wherein exposing the material to a second UV light sources increases crosslinking within the material.

22. The method of claim 10 wherein the chamber is a multi-station chamber (c) and (f) occur in different stations in a multi-station chamber.

23. The method of claim 20 wherein the chamber comprises multiple unique UV exposure areas each uniquely associated with at least one of the plurality of UV light sources.

24. The method of claim 1, wherein the UV radiation at the first UV power performs porogen removal through photochemically induced reactions to vaporize the porogen.

25. The method of claim 1, wherein operation (b) occurs in the presence of oxygen such that the UV radiation at the first UV power acts to produce ozone and/or oxygen radicals that oxidize the porogen.

26. The method of claim 1, wherein the porogen is organic.

* * * * *